United States Patent
Nagata et al.

(10) Patent No.: US 9,065,021 B2
(45) Date of Patent: Jun. 23, 2015

(54) DISPLAY DEVICE

(71) Applicant: Japan Display Inc., Tokyo (JP)

(72) Inventors: Tetsuya Nagata, Tokyo (JP); Tohru Sasaki, Tokyo (JP); Yoshinori Ishii, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/016,396

(22) Filed: Sep. 3, 2013

(65) Prior Publication Data

US 2014/0061624 A1 Mar. 6, 2014

(30) Foreign Application Priority Data

Sep. 3, 2012 (JP) .................. 2012-192899

(51) Int. Cl.
*H01L 33/48* (2010.01)
*H01L 51/52* (2006.01)
*H01L 27/32* (2006.01)

(52) U.S. Cl.
CPC ................. *H01L 33/48* (2013.01); *H01L 27/32* (2013.01); *H01L 51/5246* (2013.01)

(58) Field of Classification Search
CPC ...... H01L 33/48; H01L 51/5246; H01L 27/32
USPC ...................................... 257/40, 79
See application file for complete search history.

(56) References Cited

U.S. PATENT DOCUMENTS

2011/0114991 A1* 5/2011 Lee ............................... 257/100

FOREIGN PATENT DOCUMENTS

JP 2007-233117 A 9/2007

* cited by examiner

*Primary Examiner* — Elias M Ullah
(74) *Attorney, Agent, or Firm* — Lowe Hauptman & Ham, LLP

(57) ABSTRACT

A space between a lower substrate and an upper substrate including an organic EL light-emitting layer which includes a display region for displaying an image is filled by a dam material which is applied to enclose an exterior edge of the display region and a filling material which is dripped into the interior side of the dam material. The dam material is an epoxy resin with a comparatively high viscosity before hardening and the filling material is an epoxy resin with a comparatively low viscosity before hardening. A substrate concave part is formed between the display region on a surface of the lower substrate and a coating region of the dam material.

18 Claims, 10 Drawing Sheets

DISPLAY DEVICE

CROSS REFERENCE TO RELATED APPLICATIONS

This application is based upon and claims the benefit of priority from the prior Japanese Patent Application No. 2012-192899, filed on Sep. 3, 2012, the entire contents of which are incorporated herein by reference.

FIELD

The present invention is related to a display device arranged with a sealing material of an organic EL (electroluminescence) light emitting layer.

BACKGROUND

The development of an OLED (organic light-emitting diode) device is progressing in recent years with the goal of achieving a thin, high intensity and high speed display panel. The OLED device is a display panel in which each pixel is formed from at least three organic compound light-emitting diodes individually emits light in three colors (red, green, blue). The OLED device shows promise as a next generation display panel, because there is no mechanical operation which allows fast reaction speeds, each pixel itself emits light which allows a high intensity display and since a backlight is not necessary which allows it being a thin element (for example, refer to Japanese Unexamined Patent Application Publication 2007-233117).

FIG. 12 is a vertical cross-sectional diagram which shows a stacked layer structure of an OLED device. As is shown in FIG. 12, an organic EL light-emitting layer 1 is formed don a hard substrate 2 such as glass. Although a detailed depiction is omitted in FIG. 12, the organic EL light-emitting layer 1 is formed by stacking a TFT drive circuit layer, a reflection electrode, a hole injection layer, a hole transport layer, a light-emitting layer, an electron transport layer, an electron injection layer and a transparent electrode in this order from the substrate 2. Furthermore, for example, an organic film included in these stacked layers may sometimes also be located in a region in which the substrate in FIG. 12 contacts a sealing layer 3.

In addition, because the organic EL light-emitting layer 1 rapidly degrades when exposed to the water component within an atmosphere, it is necessary to separate the light-emitting layer from external air. As a result, the surface of the organic EL light-emitting layer 1 is covered by a sealing layer 3 comprised from a SiN film formed by CVD and also covered by a substrate 6 comprised from a hard transparent material such as glass.

The surface of the organic EL light-emitting layer 1 and the surface of the substrate 6 are maintained in parallel by maintaining a gap with a fixed distance between the substrate 6 and the sealing layer 3 and a transparent epoxy resin (UV hardened, thermal hardened etc) 4, 5 is filled into the gap in order to prevent reflection or refraction at the interface of the substrate and sealing layer. More specifically, the epoxy resin 4 with comparatively high viscosity before hardening is arranged along a periphery edge between the substrates 2, 6 and the epoxy resin 5 with a comparatively low viscosity before hardening is filled into the space enclosed by the epoxy resin 4. In this way, because the epoxy resin 4 with a comparatively high viscosity before hardening encloses the epoxy resin 5 with a comparatively low viscosity before hardening, the epoxy resin 5 does not flow out to the periphery even before hardening and the epoxy resin with a comparatively low viscosity passes evenly across the surface of the sealing layer 3. Hereinafter, the epoxy resin 4 with a relatively high viscosity before hardening is called a "dam material" and the epoxy resin 5 with a relatively low viscosity before hardening is called a "filling material", due to the difference in functions of this dam material 4 and filling material 5.

In addition, a part formed by forming the organic EL light-emitting layer 1 and the sealing layer 3 on the surface of the substrate 2 is called "lower substrate 7" and the substrate 6 is called "upper substrate 6" hereinafter. A process for bonding both substrates 7 and 6 together using the dam material 4 and filling material 5 is explained using FIG. 13 to FIG. 16. Furthermore, the bonding process is performed within a chamber which forms a manufacturing device not shown in the diagram.

First, the manufacturing device which is not shown in the diagram applies the dam material 4 using a dispenser along a periphery edge on the surface (surface of the sealing layer 3) of the lower substrate 7 as is shown in FIG. 13. A more detailed explanation is provided below. FIG. 17 is a planar diagram of an OLED element 10. As is shown in FIG. 18 which is an expanded view diagram of the part shown by the dash line in FIG. 17, the dam material 4 is applied so as to enclose the exterior edge of a display region 10a (region where effective pixels displaying image exist) of the organic EL light-emitting layer 1 at the surface (surface of the sealing layer 3) of the lower substrate 7. In addition, the region on the inner side of the dam material 4 is a filling region 7a of the filling material 5. In this way, arranging the dam material further to the exterior side than the exterior edge of the display region of the organic EL light-emitting layer 1 is to prevent a refractive-index distribution due to a slight refraction difference between the dam material 4 and filling material 5 which causes a warp in image.

Next, the manufacturing device which is not shown in the diagram drips several drops of the filling material 5 at an equal pitch in two intersecting directions on the interior side of the dam material 4 at the surface (surface of the sealing layer 3) of the lower substrate 7 as is shown in FIG. 14. In this way, because dripping the filling material 5 in drops provides the filling material 5 with a spherical form due to surface tension, it is possible to obtain a sufficient volume of the filing material 5 inside the dam material 4 with the filling material 5 arranged in drops.

Next, the manufacturing device which is not shown in the diagram rapidly applies pressure to the interior of the chamber, the lower substrate 7 and upper substrate 6 are mutually and continually aligned as is shown in FIG. 15 and both substrates 6 and 7 are overlapped as is shown in FIG. 16. In this way, the filling material which is scattered within the dam material 4 is spread out, mutual gaps (spaces) are filled in and spaces enclosed by the substrates 6 and 7 and the dam material 4 are filled as is shown in FIG. 19 which is vertical cross-sectional diagram along the line A-A' in FIG. 18.

Following this, the manufacturing device which is not shown in the diagram returns the gas within the chamber to be atmosphere pressure extracts the bonded substrates 6 and 7 from the chamber and performs a hardening process of the dam material 4 and filling material 5. For example, in the case where a UV hardening type epoxy resin is used as the dam material 4 and a thermal hardening epoxy resin is used as the filling material 5, the manufacturing device which is not shown in the diagram first thermally hardens the filling material 5 within a heating furnace after irradiating UV to the dam material 4 through the upper substrate 6. In addition, in the case where a retarder type UV hardening epoxy resin is used as the dam material 4 and filling material 5, UV rays are irradiated to the dam material 4 and filling material 5 before bonding the substrates 6 and 7. In this way, because the dam material 4 and filling material 5 begins to harden after the point at which the substrates 6 and 7 are bonded together, hardening is completed within a hardening furnace.

Furthermore, although one OLED device is shown as being formed on one substrate 2 in FIG. 13 to FIG. 16, in an actual manufacturing process, a plurality of OLED device may be formed on one substrate 2 and individual OLED device may be cut from the bonded substrates 6 and 7 after hardening of the dam material 4 and filling material 5.

If the bonding process described above is ideally carried out, the filling material 5 should be filled into the interior side of the dam material 4 without any gaps as is shown in FIG. 18 and FIG. 19. However, because pressure is actually insufficient when bonding is performed, air molecules remain in the spaces enclosed by the substrates 6 and 7 and the dam material 4, gas vaporizes from the dam material 4 and filling material 5, and gas bubbles B may be generated on the interior side of the dam material 4 due to some problem with the bonding process. Generation of the gas bubbles B is inevitable since the reason for the generation of gas bubbles B has strictly speaking still not been ascertained. In addition, as is shown in FIG. 20 and FIG. 21 which correspond to FIG. 18 and FIG. 19, when gas bubbles B are generated and overlap the display region of the organic EL light-emitting layer 1, the interface between the gas bubbles B and the filling material 5 refracts, reflects, scatters or adsorbs the light from each pixel below the gas bubbles B in the display region of the organic EL light-emitting layer 1 and as a result, an image displayed on a displayed region becomes warped or missing.

Furthermore, although these gas bubbles B are easily generated in the four corners of the dam material 4, it is also known that the gas bubbles B can also be generated in locations opposite to a portion of dam material 4 other than the four corners.

An aim of the present invention is to provide a display device in which gas bubbles do not overlap on a display region as a result of the gas bubbles being incorporated into portions other than a display region of an organic EL light-emitting layer even in the case where gas bubbles are generated within a filling material filled into spaces enclosed by a dam material and a pair of substrates which seal the organic EL light-emitting layer due to some cause. Aims and new features of the present invention other than those described above will become clear via the descriptions of the present specification and attached drawings.

SUMMARY

A explanation of the concept of a representative invention among the inventions disclosed in the present application is given below.

A first aspect of a display device according to the present invention is a display device including a display region for displaying an image including a first substrate including an organic EL light-emitting layer, a second substrate facing the first substrate, the first or second substrate including a first surface facing the other substrate, a dam material arranged to enclose the display region and for bonding first and second substrates together, a concave part being arranged between the display region and the dam material on the first surface, and a filling material for filling spaces enclosed by the first and second substrates and the dam material.

A second aspect of a display device according to the present invention is a display device including a display region for displaying an image including a first substrate including an organic EL light-emitting layer, a second substrate facing the first substrate, a dam material arranged to enclose the display region and for bonding first and second substrates together, an interval between the first and second substrates being comprised from a first interval and a second interval larger than the first interval at a boundary portion between the display region and the dam material, the interval stepwise changing at the boundary portion between a first region with the first interval and a second region with the second interval, and a filling material for filling spaces enclosed by the first and second substrates and the dam material.

DESCRIPTION OF EMBODIMENTS

The best embodiments for realizing the OLED element according to the present invention are explained below with reference to the accompanying drawings. Each embodiment described below is based on knowledge discovered as a result of research by the inventors of the present invention over a long period of time that gas bubbles stabilize after moving along an asperity shape of the substrate in the case where gas bubbles are generated on a substrate formed with asperities", and a concave shape (groove or step) for incorporating the gas bubbles is formed between the display region at the surface of a lower substrate 7 and a region a dam material is to be applied.

First Embodiment

Figure 1:
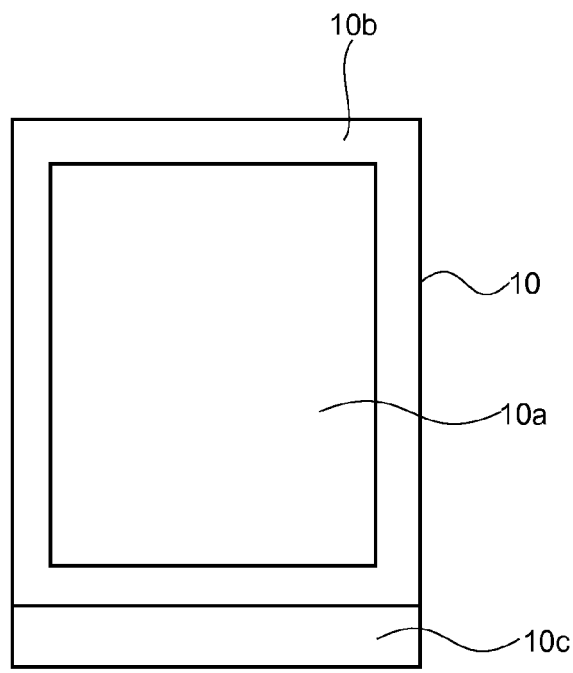
FIG. 1 is a planar diagram of an OLED element of a first embodiment.
Figure 12:
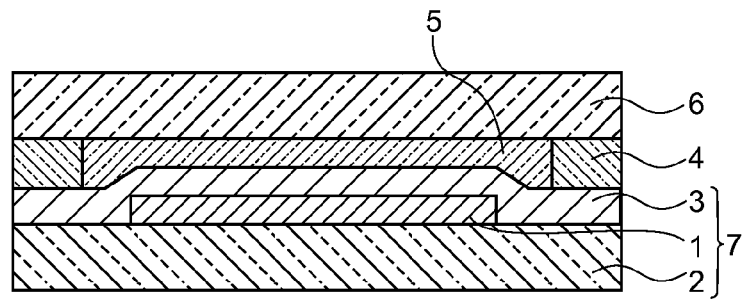
FIG. 12 is a vertical cross sectional diagram of the OLED element.
Figure 13:
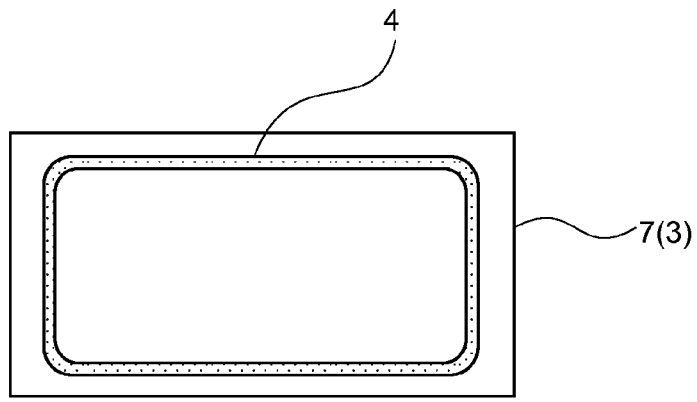
FIG. 13 is a diagram of a bonding process of an OLED element.
Figure 14:
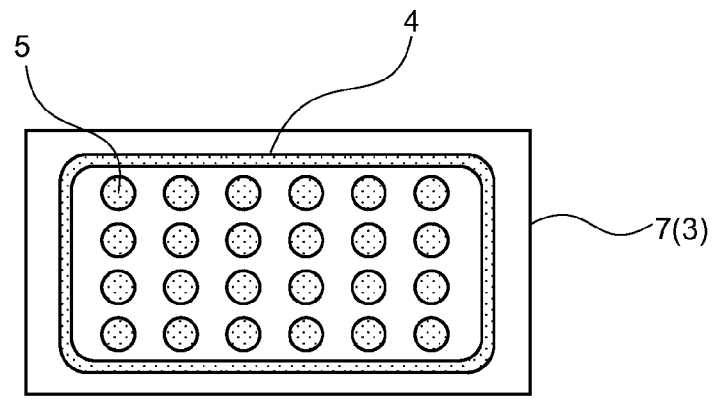
FIG. 14 is a diagram of a bonding process of an OLED element.
Figure 15:
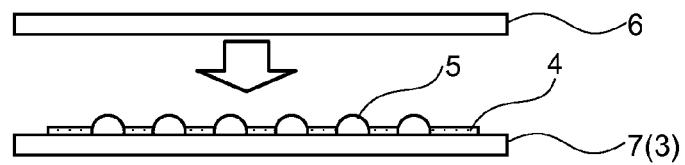
FIG. 15 is a diagram of a bonding process of an OLED element.
Figure 16:
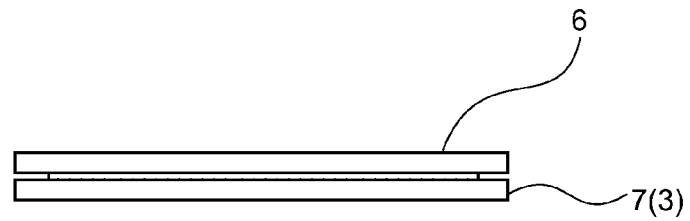
FIG. 16 is a diagram of a bonding process of an OLED element.
Figure 17:
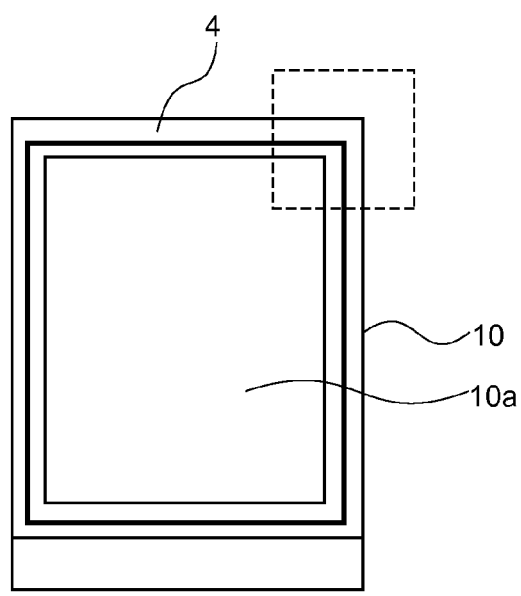
FIG. 17 is a diagram showing a prior art.
Figure 18:
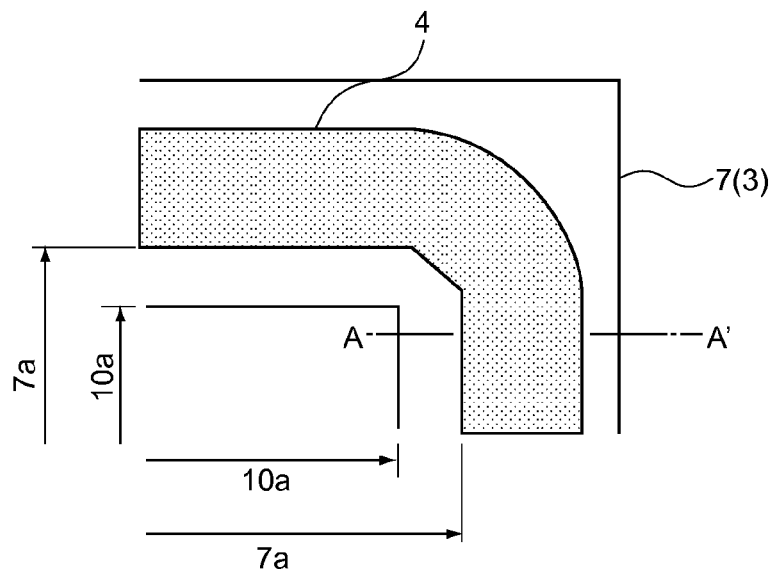
FIG. 18 is an expanded view diagram of the dash line section in FIG. 17.
Figure 19:
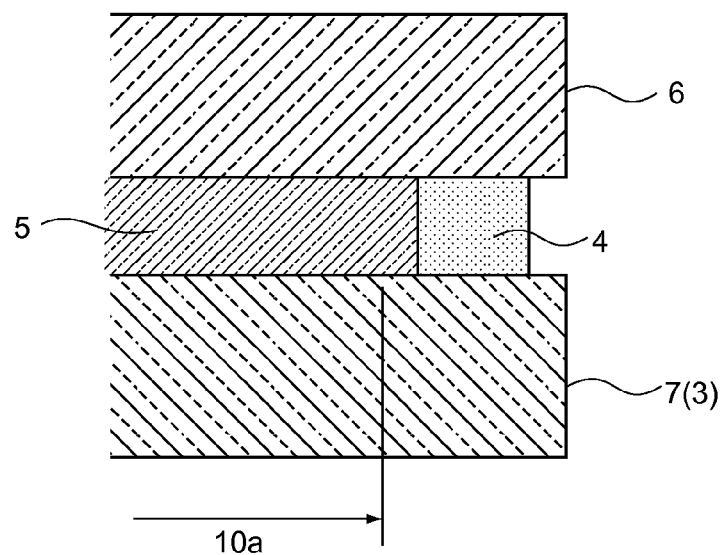
FIG. 19 is a cross-sectional diagram showing a vertical cross section along the line A-A' in FIG. 18.
Figure 20:
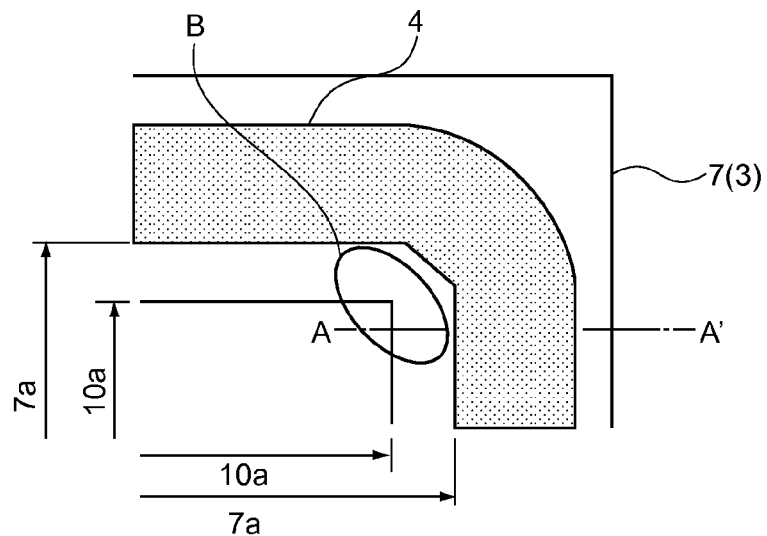
FIG. 20 is an expanded view diagram of the dash line section in FIG. 17.
Figure 21:
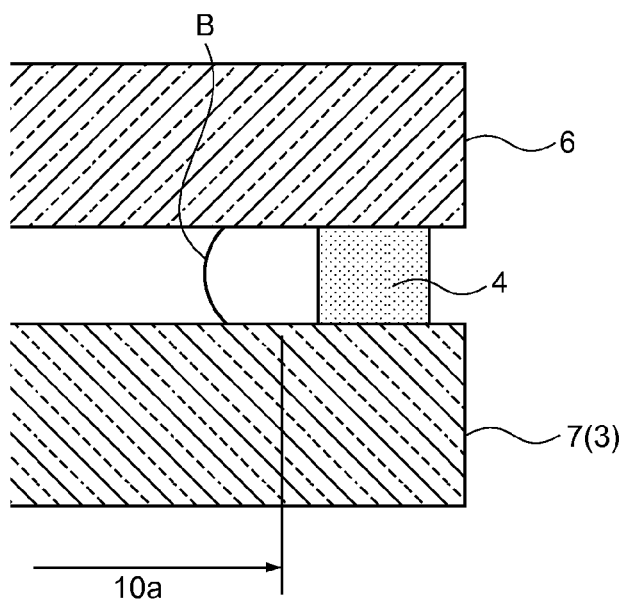
FIG. 21 is a cross-sectional diagram showing a vertical cross section along the line A-A' in FIG. 20.

A planar surface of an OLED device 1 is shown in FIG. 1 as the first embodiment of the present invention. As is shown in FIG. 1, the OLED device 10 has a rectangular shaped display region 10a which displays an image by the presence of an effective pixel of the organic EL light-emitting layer 1, a frame region 10b formed to enclose the display region 10a and laid with wires etc. which transmit a drive signal to a TFT drive circuit layer which forms the organic EL light-emitting layer 1, and a terminal region 10c which is the section projecting from one side of the exterior edge of the frame region 10b and which is formed with a driver (source driver, gate driver) for driving the TFT drive circuit layer. Furthermore, forming the OLED device 10 is formed from a substrate 2, the organic EL light-emitting layer 1, a lower substrate (first substrate) including a sealing layer 3, an epoxy resin (dam material 4, filling material 5) and an upper substrate 6 (second substrate) as is explained above with reference to FIG. 12. In addition, as explained above with reference to FIG. 13 to FIG. 16, the manufacturing process includes first creating the lower substrate 7 by forming the organic EL light-emitting layer 1 and sealing layer 3 in order on the substrate 2 and thereafter applying epoxy resin with a comparatively high viscosity before hardening in a rectangular frame shape on the exterior side of an exterior edge of the display region 10a on the surface of the organic EL light-emitting layer 1 to be used as a dam material 6 (FIG. 13), dropping epoxy resin with a comparatively low viscosity before hardening in individual drops at a certain pitch in two intersecting directions on the interior side of the dam material 6 which is to be used as a filling material 5 (FIG. 15), spreading the filling material 5 into all of the spaces enclosed by the substrates 6 and 7 and hardening the dam material 4 and filling material 5 are hardened under an atmosphere.

Figure 2:
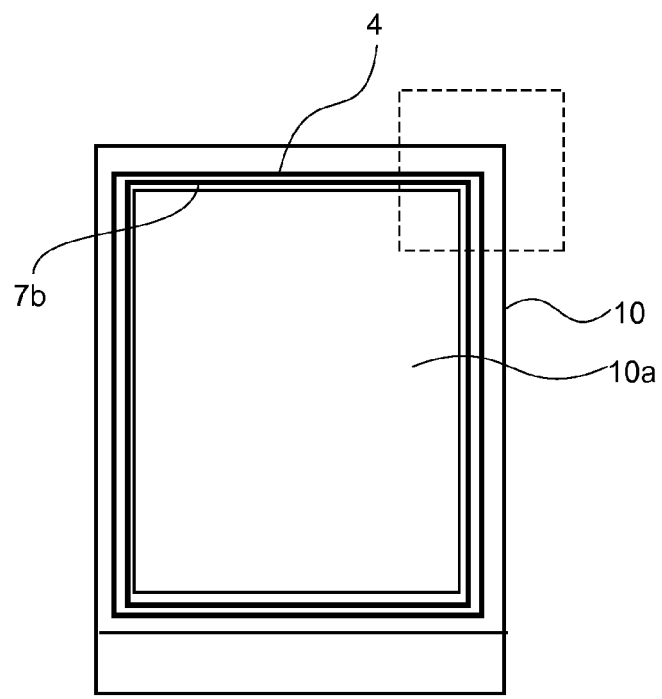
FIG. 2 is a planar perspective view diagram of the OLED element.
Figure 3:
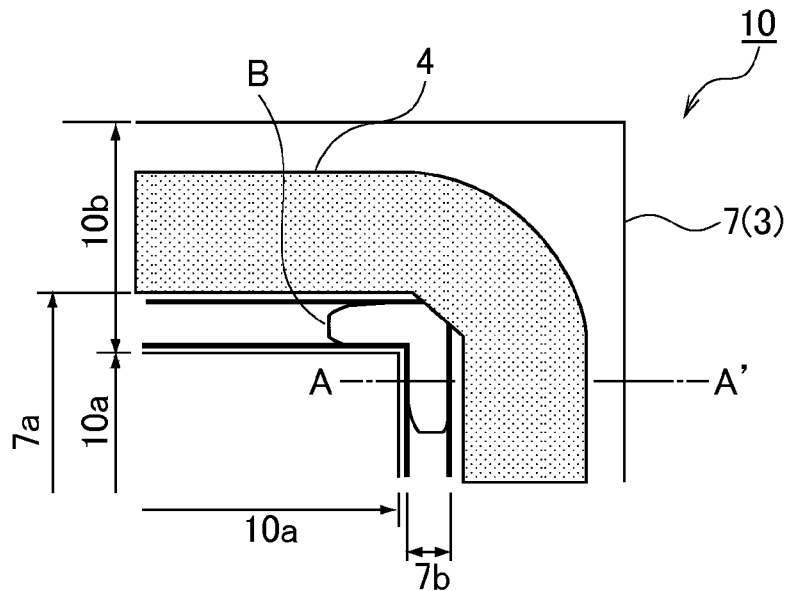
FIG. 3 is an expanded view diagram of the dash line section in FIG. 2.

FIG. 2 is a perspective view diagram showing a shape of the upper surface of the lower substrate 7 of the OLED device 10 seen from the side of the upper substrate 6 in the present embodiment and FIG. 3 is an expanded view diagram of the dash line in FIG. 2. As is shown in FIG. 3, a rectangular frame shaped region which is on the exterior side of the display region (rectangular region arranged with an effective pixels displaying an image) of the organic EL light-emitting layer 1 at the surface (surface of the sealing layer 3) of the lower substrate is the frame region 10b which does not display image. For example, the width of the frame region 10b is 1.0~1.5 mm.

The dam material 4 is applied to a width of about 0.8 mm along the exterior edge of the display region 10a at approximately the center of the frame region 10b leaving an interval of approximately 200 µm with the display region 10a. As described above, the interior side of the dam material 4 is a filling region 7a of the filling material 5.

A series of grooves (referred to as "substrate concave part 7b" below) are formed with a width of approximately a few tens of µm and a depth of 1 µm~10 µm on the circumference of a belt shaped region sandwiched between an interface line with the display region 10 and the dam material 4 within the frame region 10b. The distance between the substrate concave part 7b and the display region 10a is almost equivalent to the distance between the substrate concave part 7b and the dam material 4 spread out by the upper substrate 6. Furthermore, the substrate concave part 7b formed in a groove shape by removing a section of an organic film not shown in the diagram but formed on the substrate 2 using a photolithography process. The organic film may include a TFT drive circuit layer for example. In addition, the sealing layer 3 is also formed on an interior surface of the grove shape. The substrate concave part 7b has a sufficient size for controlling the shape of gas bubbles. In the case where the substrate concave part 7b is formed using a photolithography process, the depth of the substrate concave part 7b is preferably 1 µm~3 µm.

Figure 4:
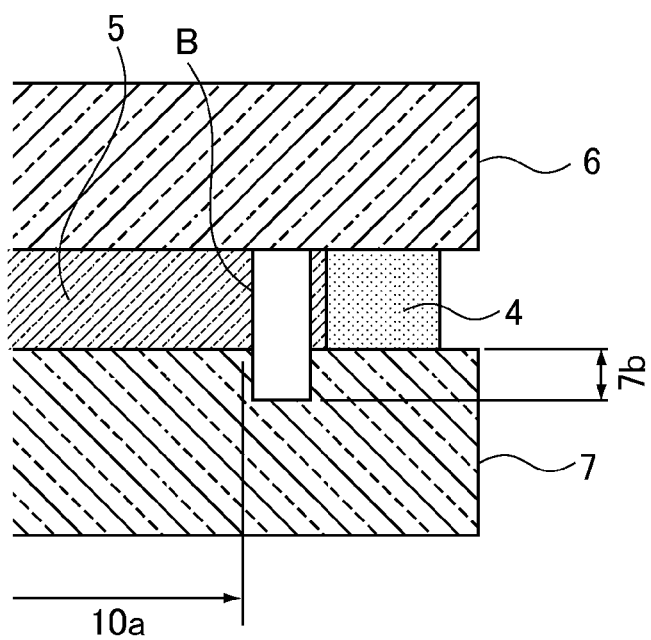
FIG. 4 is a cross-sectional diagram showing a vertical cross section along the line A-A' in FIG. 3.

When gas bubbles B are generated within the filling material 5 before the dam material 4 and filling material 5 become hard, the gas bubbles B follows the concave shape of the substrate concave part 7b, become drawn into the substrate concave part 7b and become stable. At this time, the gas bubbles B contact the upper surface of the lower substrate 7 (that is, a sealing layer 3) and the lower surface of the upper substrate 6 and appear to gather in one place due to surface tension between the filling material 5 and the gas bubbles B. Therefore, as is shown in FIG. 4 (vertical cross-sectional diagram along the line A-A' in FIG. 3), the gas bubbles B become stable between the bottom surface of the substrate concave part 7b and the lower surface of the upper substrate 6. The interval between the substrates 6 and 7 when the OLED element 1 is completed is approximately 6.5~8.5 um and the interval between the substrates 6 and 7 at the places where the substrate concave part 7b exists is stepwise expanded than the places where the substrate concave part 7b doesn't exist.

As a result, as is shown in FIG. 3 and FIG. 4, the gas bubbles B are contained within the substrate concave part 7b and do not protrude to the exterior regardless of the volume of the gas bubbles. That is, when the volume of the gas bubbles B increases, the area within the substrate concave part 7b taken up by the gas bubbles B expands and when the volume of the gas bubbles B decreases, the area within the substrate concave part 7b taken up by the gas bubbles B contracts. However, in either case the gas bubbles B do not protrude from the substrate concave part 7b in a planar view. In addition, since the position of the gas bubbles B is fixed when the dam material 4 and filling material 5 become hard, the gas bubbles B are prevented from overlapping the display region 10a of the organic EL light-emitting layer 1 and warped or missing images due to gas bubbles B is avoided.

Second Embodiment

Figure 5:
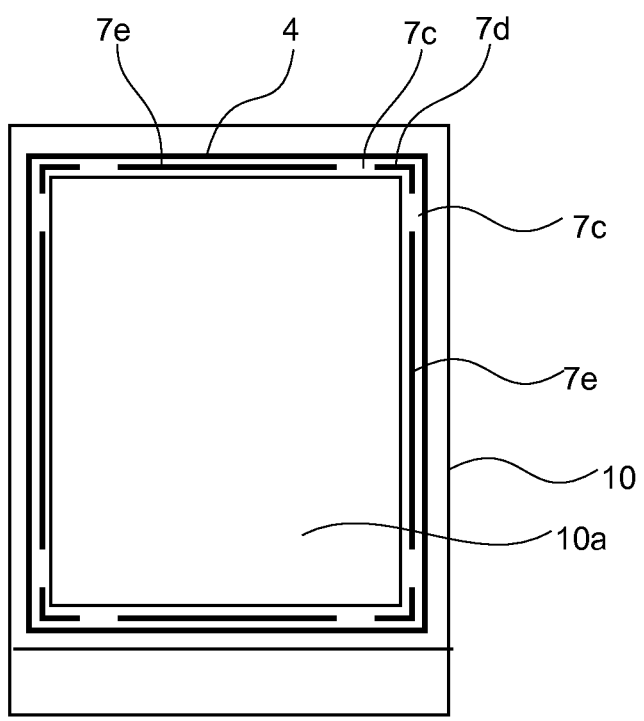
FIG. 5 is a planar perspective view diagram of the OLED element of a second embodiment.

FIG. 5 is a perspective view showing a surface shape of the lower substrate 7 of the OLED device 10 seen from the side of the upper substrate 6 related to the second embodiment of the present invention.

According to the first embodiment described above, because the substrate concave part 7b is continuously formed along the exterior edge of the display region 10a, wiring which transmits a drive signal to a TFT drive layer of the organic EL light-emitting layer 1 from the terminal region 10c must pass across the substrate concave part 7b. In the case where wiring is forming on this asperity shaped surface, it is likely that the wiring will break. Thus, in the second embodiment, the substrate concave part 7b is divided into a plurality of parts and a section which is sandwiched between each of these divided substrate concave parts remains as a smooth part 7c for passing wiring between the interior and exterior of the frame region 10b. Specifically, each hook shaped substrate concave part 7d in a planar view is formed on the interior side of each curved part of the dam material 4 in the four corners of the frame region 10b and each straight line shaped substrate concave part 7d is formed parallel with each of the four sides of the frame region 10b.

In the present embodiment, since gas bubbles B are originally generated in the vicinity of the dam material 4, the generated gas bubbles B are drawn into either of the substrate concave parts 7d, 7e and move to the spaces sandwiched by the interior surface of the dam material 4 and the upper substrate 6. As a result, in a planar view, the gas bubbles B are contained within the substrate concave parts 7b, 7c and do not protrude to the exterior regardless of the volume of the gas bubbles.

Since other structures and effects in the present embodiment are exactly the same as those described in the first embodiment, they are incorporated herein.

Third Embodiment

Figure 6:
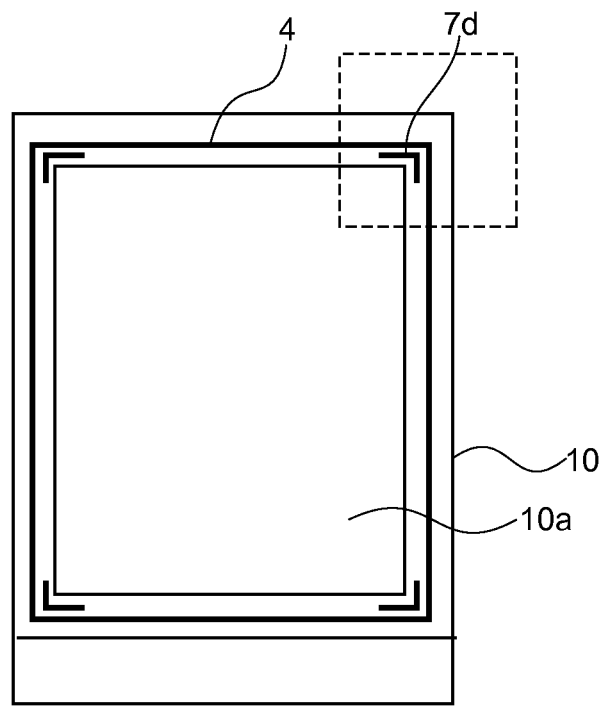
FIG. 6 is a planar perspective view diagram of the OLED element of a third embodiment.
Figure 7:
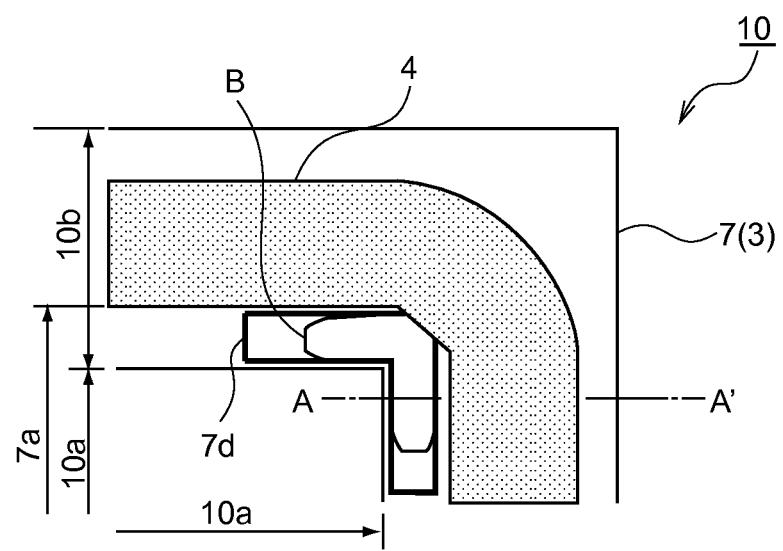
FIG. 7 is an expanded view diagram of the dash line section in FIG. 6.

FIG. 6 is a perspective view diagram showing a surface shape of the lower substrate 7 of the OLED device 10 seen from the side of the upper substrate 6 related to the third embodiment of the present invention and FIG. 7 is an expanded view of the dash line section in FIG. 6.

It can be understood from statistical results related to generation of the gas bubbles B in a bonding process of the OLED device 10 that the gas bubbles B are generated most frequently on the interior side of the four corners of the dam material 4 applied in a rectangular shape. Thus, in the present embodiment, compared to the second embodiment described above, only the hook shaped substrate concave parts 7d formed on the interior side of each curved section of the dam material 4 at each of the four corners of the frame region 10b remain and the straight line shaped substrate concave parts 7e are omitted. Furthermore, if the length of straight line parts (length in a parallel direction to the exterior edge of the display region 10a starting from the point where the curve begins) is approximately 100 um~1 nm, then each substrate concave part 7d can sufficiently function as a trap for drawing the gas bubbles B.

In the present embodiment, since the places where the gas bubbles B are frequently generated are on the interior side of the curved sections of the dam material 4, the generated gas bubbles B are drawn into either of the substrate concave parts 7d and move to the spaces sandwiched by the interior surface of the dam material 4 and the upper substrate 6. As a result, in a planar view, the gas bubbles B are contained within the substrate concave parts 7d and do not protrude to the exterior regardless of the volume of the gas bubbles.

Since other structures and effects in the present embodiment are exactly the same as those described in the first embodiment, they are incorporated herein.

Fourth Embodiment

Figure 8:
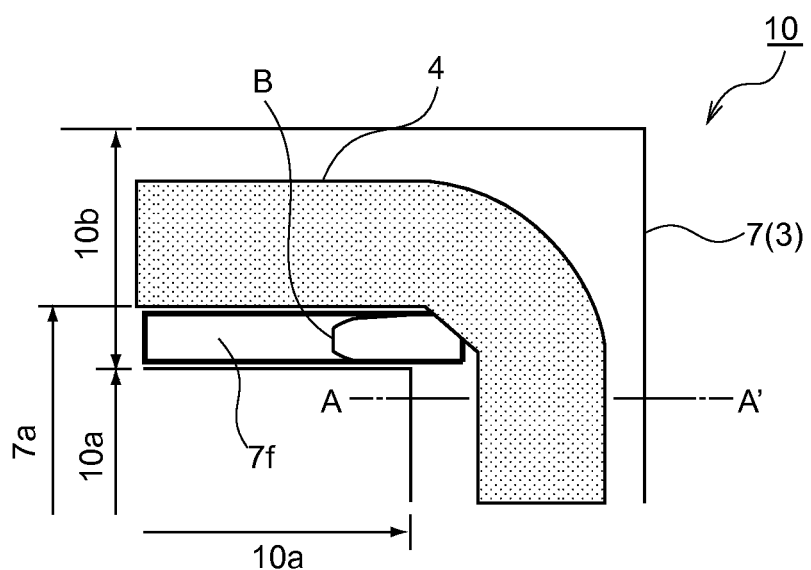
FIG. 8 is a planar perspective view diagram showing a part of the OLED element of a fourth embodiment.

FIG. 8 is a perspective view diagram showing a part of a surface shape of the lower substrate 7 of the OLED device 10 seen from the side of the upper substrate 6 related to the fourth embodiment of the present invention. In the present embodiment the shape of a substrate concave part 7f is not a hook shape but a straight line shape starting from the interior side of a curved section of the dam material 4 at the four corners of the frame region 10b. Even when this shape is adopted, if the area of the substrate concave part 7f corresponds to the volume of the gas bubbles B which are generated, the substrate concave part 7f can sufficiently function as a trap for drawing the gas bubbles B.

In the present embodiment, since the places where the gas bubbles B are frequently generated are on the interior side of the each curved section of the dam material 4, the generated gas bubbles B are drawn into either of the substrate concave parts 7f and move to the spaces sandwiched by the interior surface of the dam material 4 and the upper substrate 6. As a result, in a planar view, the gas bubbles B are contained within the substrate concave parts 7f and do not protrude to the exterior regardless of the volume of the gas bubbles.

Since other structures and effects in the present embodiment are exactly the same as those described in the first embodiment, they are incorporated herein.

Fifth Embodiment

Figure 9:
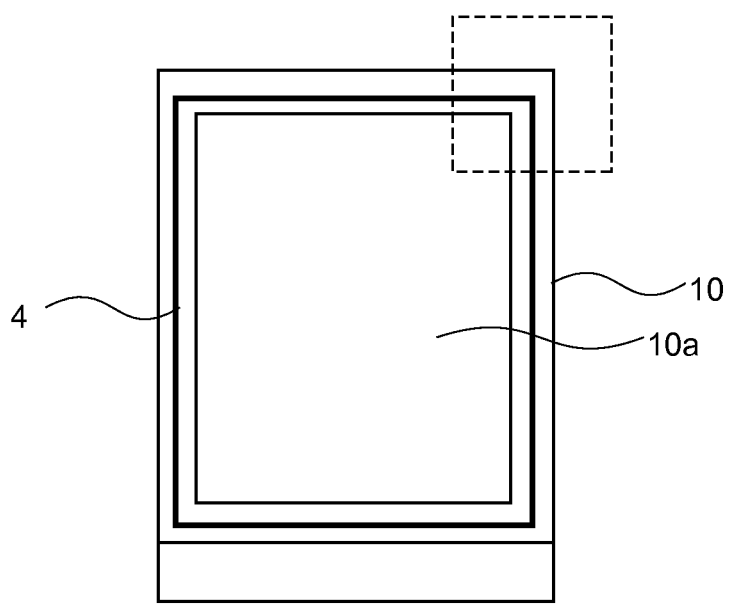
FIG. 9 is a planar perspective view diagram of the OLED element according to a fifth embodiment.
Figure 10:
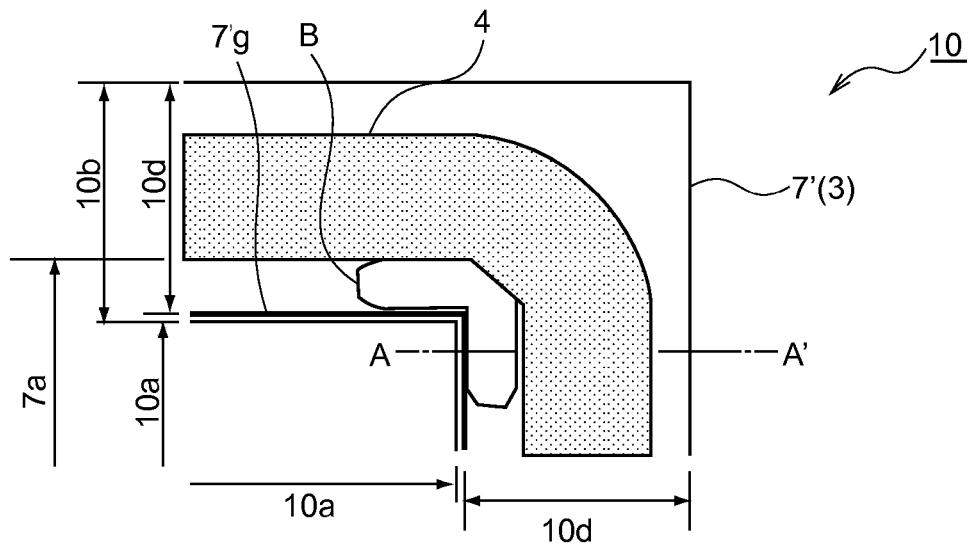
FIG. 10 is an expanded view diagram of the dash line section in FIG. 9.
Figure 11:
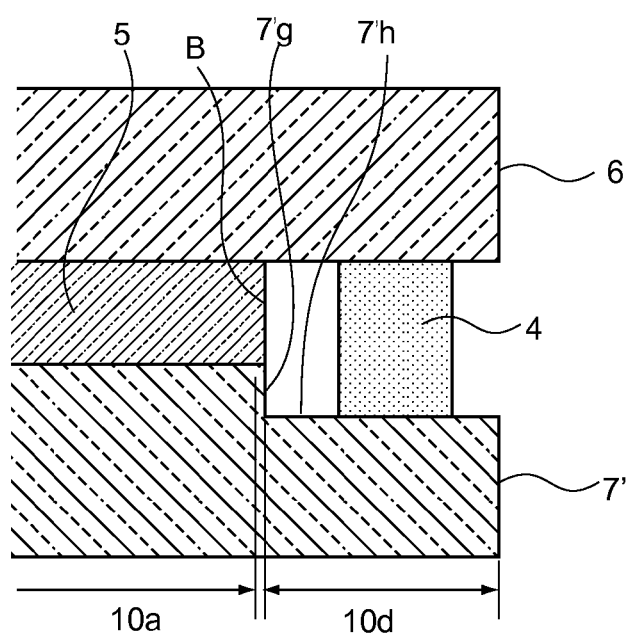
FIG. 11 is a cross-sectional diagram showing a vertical cross section along the line A-A' in FIG. 10.

FIG. 9 is a perspective view diagram showing a surface shape of the lower substrate 7 of the OLED device 10 seen from the side of the upper substrate 6 related to the fifth embodiment of the present invention, FIG. 10 is an expanded view of the dash line section in FIG. 9 and FIG. 11 is a vertical cross-sectional view along the line A-A' in FIG. 10.

In the present embodiment, compared to the first embodiment described above, the substrate concave part which draws and stabilizes the gas bubbles B is formed by a step 7'g (a step formed by removing a section of an organic film not shown in the diagram formed on the surface of the substrate 2, through a photolithography process) formed on the surface of a lower substrate 7' and a side wall of the dam material 4.

That is, as is shown in FIG. 11, the display region 10b of the lower substrate 7' in the present embodiment includes the step 7'g in which a region of the exterior edge side is lower by approximately 10 μm than the side of the display region 10a slightly to the exterior than an interface line with the display region 10a. A region (step formation region 10d) on the opposite side of the display region 10a of the step 7'g is a flat surface. The dam material 4 is applied on the step formation region 10d with an interval with the step 7'g of approximately a few tens of μm. As a result, because spaces enclosed by the step 7'g formed on the surface of the frame region 10b of the lower substrate 7' and the dam material 4 form a concave part 7'h which stepwise expands the interval between the lower substrate 7' and the upper substrate 6 more than other sections, the generated gas bubbles B are drawn into the concave part 7'h and move to the spaces sandwiched by the interior surface of the dam material 4 and the upper substrate 6. As a result, in a planar view, the gas bubbles B are contained within the substrate concave parts 7'h and do not protrude to the exterior regardless of the volume of the gas bubbles.

Since other structures and effects in the present embodiment are exactly the same as those described in the first embodiment, they are incorporated herein. The sealing layer 3 may also be formed on the interior surface of the concave part 7'h as in the first embodiment.

Modified Example

In each of the embodiments explained above, the substrate concave parts 7b, 7d, 7e, 7f and 7'h are formed on the lower substrate 7 and 7'h. However, the substrate concave parts may also be formed on the lower surface of the upper substrate 6.

According to the display device of the present invention, gas bubbles B are drawn into parts of an organic EL light-emitting layer 1 other than a display region even in the case where gas bubbles B are unavoidably generated for some reason within a filling material which is filled into spaces enclosed by a pair of substrates for sealing the organic EL light-emitting layer and a dam material and consequently the gas bubbles do not become located on the display region.

What is claimed is:

1. A display device including a display region for displaying an image comprising:
   a first substrate including an organic EL light-emitting layer;
   a second substrate facing the first substrate, the first or second substrate including a first surface facing the other substrate;
   a dam material arranged to enclose the display region and for bonding the first and second substrates together, a concave part being arranged in the first substrate or the second substrate between the display region and the dam material; and
   a filling material for filling spaces enclosed by the first and second substrates and the dam material.

2. The display device according to claim 1, wherein the concave part is arranged in the first substrate.

3. The display device according to claim 2, wherein the first substrate includes a sealing layer covering the organic EL light-emitting layer and the sealing layer is located on an interior surface of the concave part.

4. The display device according to claim 3, wherein the sealing layer includes SiN.

5. The display device according to claim 3, wherein the first substrate includes an organic film, the sealing layer is located on a top layer of the organic film, the concave part is arranged on the organic film and the sealing layer, and the sealing layer is located along a surface of the organic film in the concave part.

6. The display device according to claim 1, wherein the concave part is enclosed by a step part provided in the first substrate or the second substrate and a side surface of the dam material.

7. The display device according to claim 1, wherein the concave part is a series of grooves enclosing the display region.

8. The display device according to claim 1, wherein the concave part is comprised from a plurality of groves.

9. The display device according to claim 8, wherein the display region is a rectangular shape including a plurality of corner parts and the groove is arranged at locations facing the plurality of corner parts respectively.

10. The display device according to claim 9, wherein the groove arranged at locations facing the plurality of corner parts respectively includes a curved section along each corner part.

11. The display device according to claim 1, wherein a thickness of the first substrate or the second substrate in which the concave part is arranged is smaller at the concave part than a thickness at other parts of the substrate first substrate or the second substrate in which the concave part is arranged.

12. A display device including a display region for displaying an image comprising:
   a first substrate including an organic EL light-emitting layer;
   a second substrate facing the first substrate;
   a dam material arranged to enclose the display region and for bonding first substrate and second substrate together, an interval between the first and second substrates being comprised from a first interval and a second interval larger than the first interval at a boundary portion between the display region and the dam material, the interval stepwise changing at the boundary portion between a first region with the first interval and a second region with the second interval; and
   a filling material for filling spaces enclosed by the first and second substrates and the dam material.

13. The display device according to claim 12, wherein the boundary portion is arranged in a frame shape enclosing the display region.

14. The display device according to claim 12, wherein the boundary portion is comprised from a plurality of sections.

15. The display device according to claim 14, wherein the display region is a rectangular shape including a plurality of corner parts and the plurality of sections are arranged at locations facing the plurality of corner parts respectively.

16. The display device according to claim 15, wherein the plurality of sections are arranged at locations facing the plurality of corner parts respectively includes a curved section along each corner part.

17. The display device according to claim 12, wherein one of the first and second substrates includes a first surface facing the other substrate in the second region and a first side surface at the boundary portion, and a concave part is comprised of the first surface and the first side surface.

18. The display device according to claim 12, wherein one of the first and second substrates includes a first surface facing the other substrate in the second region and a first side surface at the boundary portion, the dam material includes a second side surface, and a concave part is comprised of the first surface, the first side surface and the second side surface.

* * * * *